US009036423B2

United States Patent
Sundahl et al.

(10) Patent No.: US 9,036,423 B2
(45) Date of Patent: *May 19, 2015

(54) METHOD AND APPARATUS FOR STAGGERED START-UP OF A PREDEFINED, RANDOM OR DYNAMIC NUMBER OF FLASH MEMORY DEVICES

(71) Applicant: Spansion LLC, Sunnyvale, CA (US)

(72) Inventors: Bradley Edman Sundahl, Austin, TX (US); Sean Michael O'Mullan, Austin, TX (US); Gregory Charles Yancey, Austin, TX (US); Kenneth Alan Okin, Saratoga, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/099,340

(22) Filed: Dec. 6, 2013

(65) Prior Publication Data

US 2014/0092687 A1 Apr. 3, 2014

Related U.S. Application Data

(63) Continuation of application No. 13/162,520, filed on Jun. 16, 2011, now Pat. No. 8,625,353.

(51) Int. Cl.
*G11C 16/04* (2006.01)
*G11C 16/30* (2006.01)
*G11C 16/32* (2006.01)

(52) U.S. Cl.
CPC ............... *G11C 16/30* (2013.01); *G11C 16/32* (2013.01)

(58) Field of Classification Search
USPC ............. 365/185.33, 185.18, 185.03, 185.09, 365/185.11
See application file for complete search history.

(56) References Cited

U.S. PATENT DOCUMENTS

| 5,430,687 | A | 7/1995 | Hung et al. |
|---|---|---|---|
| 6,631,520 | B1 | 10/2003 | Theron et al. |
| 7,880,590 | B2 | 2/2011 | Jam et al. |
| 8,625,353 | B2 * | 1/2014 | Sundahl et al. .......... 365/185.18 |
| 2005/0125649 | A1 | 6/2005 | Lu et al. |
| 2005/0132160 | A1 | 6/2005 | Everett et al. |
| 2006/0143344 | A1 | 6/2006 | Lindsay et al. |
| 2007/0016618 | A1 | 1/2007 | Robert et al. |
| 2008/0040818 | A1 | 2/2008 | Iima et al. |
| 2011/0179195 | A1 | 7/2011 | O'Mullan et al. |
| 2012/0320680 | A1 | 12/2012 | Sundahl et al. |

OTHER PUBLICATIONS

Notice of Allowance for U.S. Appl. No. 13/162,520, mailed Aug. 22, 2013; 10 pages.

* cited by examiner

*Primary Examiner* — Andrew Q Tran

(57) ABSTRACT

A method, apparatus, and manufacture for memory device startup is provided. Flash memory devices are configured such that, upon the power supply voltage reaching a predetermined level, each flash memory is arranged to load the random access memory with instructions for the flash memory, and then execute a first portion of the instructions for the flash memory. After executing the first portion of the instructions for the flash memory, each separate subset of the flash memories waits for a separate, distinct delay period. For each flash memory, after the delay period expires for that flash memory, the flash memory executes a second portion of the instructions for the flash memory.

10 Claims, 6 Drawing Sheets

US 9,036,423 B2

METHOD AND APPARATUS FOR STAGGERED START-UP OF A PREDEFINED, RANDOM OR DYNAMIC NUMBER OF FLASH MEMORY DEVICES

This application is a continuation of U.S. patent application Ser. No. 13/162,520 filed Jun. 16, 2011, the disclosure of which is incorporated by reference herein in its entirety.

TECHNICAL FIELD

The invention is related to computer-readable memory, and in particular, but not exclusively, to an apparatus, method, and manufacture for a staggered start of flash memories in a memory module.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer is formed over the top of the substrate and bit lines. The nitride serves as the charge storage layer between two insulating layers. Word lines are then famed over the top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different architectures of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Figure 1:
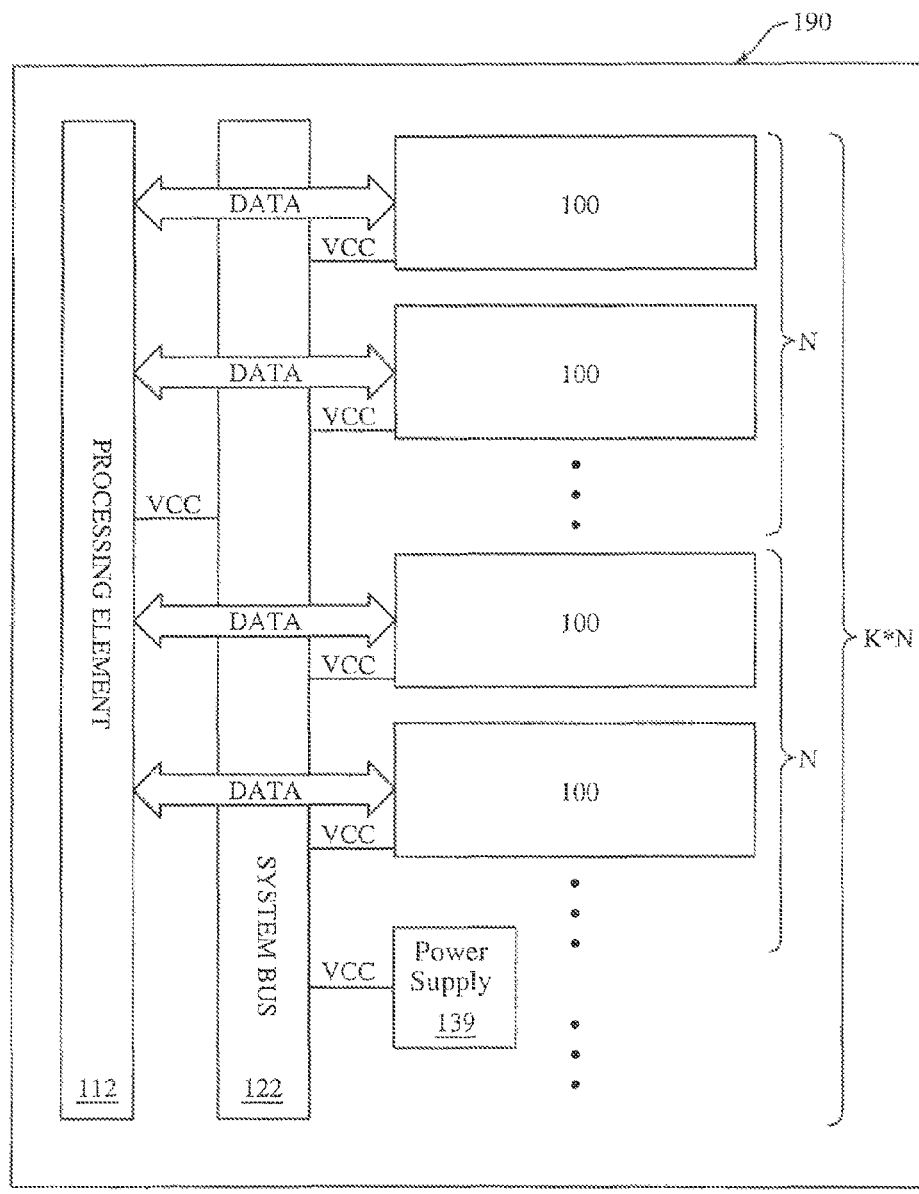
FIG. 1 illustrates a block diagram of an embodiment of a system.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "signal" means at least one current, voltage, charge, temperature, data, or other signal.

Briefly stated, a method, apparatus, and manufacture for memory device startup is provided. Flash memory devices are configured such that, upon the power supply voltage reaching a pre-determined level, each flash memory is arranged to load the random access memory with instructions for the flash memory, and then execute a first portion of the instructions for the flash memory. After executing the first portion of the instructions for the flash memory, each separate subset of the flash memories waits for a separate, distinct delay period. For each flash memory, after the delay period expires for that flash memory, the flash memory executes a second portion of the instructions for the flash memory.

FIG. 1 is a block diagram of system 190 with K*N instances of electronic device 100. System 190 includes processing element 112, system bus 122, power supply 139, and devices 100. Processing element 112 is in communication with each of the devices 100 via system bus 122. Power supply 139 is arranged to provide supply voltage VCC, which may be provided to processing element 112 and to each of the devices 100 via system bus 122. Processing element 112 may include one or more processing elements. In some embodiments, processing element 112 may be a microcontroller or the like.

K*N devices 100 comprise memory devices, such as flash memory devices. The flash memory devices may be organized into one or more memory modules. In some embodiments, each memory module is a dual inline memory module (DIMM), or the like. In the case of flash memory devices, the amount of power used by the K*N devices 100 during start-up may cause the VCC supply voltage for one or more portions of K*N devices 100 to drop. As a result, because the VCC voltage is below the nominal operating VCC voltage for K*N devices 100, one or more errors in reading or writing data can occur during the start up process. In order to reduce or eliminate the occurrence of such errors, some embodiments of system 190 provide for a staggered start-up that occurs in stages. That is, rather than starting up K*N devices 100 simultaneously, system 190 can manage the start-up process so that only N of K*N devices are started up at one time. The number of devices (N) being started up simultaneously can be predefined, random, or determined dynamically based on the number and types of devices to be updated.

Although in general system 190 was illustrated and discussed above as having K sub-sets, where each sub-sets have an equal number of elements N, the number of elements in each sub-set are not equal in all embodiments. For example, some sub-sets of devices 100 may have more devices 100 or less devices 100 than other sub-sets of devices 100. Each of the devices 100 is arranged to be powered by a power supply voltage VCC.

In some embodiments, each device 100 is a flash memory device that includes a random access memory (RAM) (not shown in FIG. 1). In some embodiments, each device 100 is a flash memory device where all of the flash memory devices 100 are powered by a single VCC power supply 139. In some embodiments, devices 100 includes K sub-sets, which are each configured such that upon the power supply voltage VCC reaching a pre-determined level, each device 100 is arranged load the RAM with instructions for the device 100, execute a first portion of the instructions for the device 100, and after executing the first portion of the instructions for the device 100, employing a countdown timer to wait for a particular delay period after executing the first portion of the instructions for the flash memory. Each of the K sub-sets has a different delay period. For example, a first sub-set of devices 100 may wait for a first delay period after executing the first portion of the instructions, and a second subset of devices 100 may wait for a second delay period after executing the first portion of the instructions, where the second delay period is different from the first delay period. In some embodiments, other subsets of devices 100, if there are other subsets, may each have still different delay periods. Each device 100, after waiting for the delay period for that subset, executes a second portion of the instructions for the device 100. In this way, the start-up of subsets of devices 100 are staggered relative to other subsets of devices 100.

Figure 2:
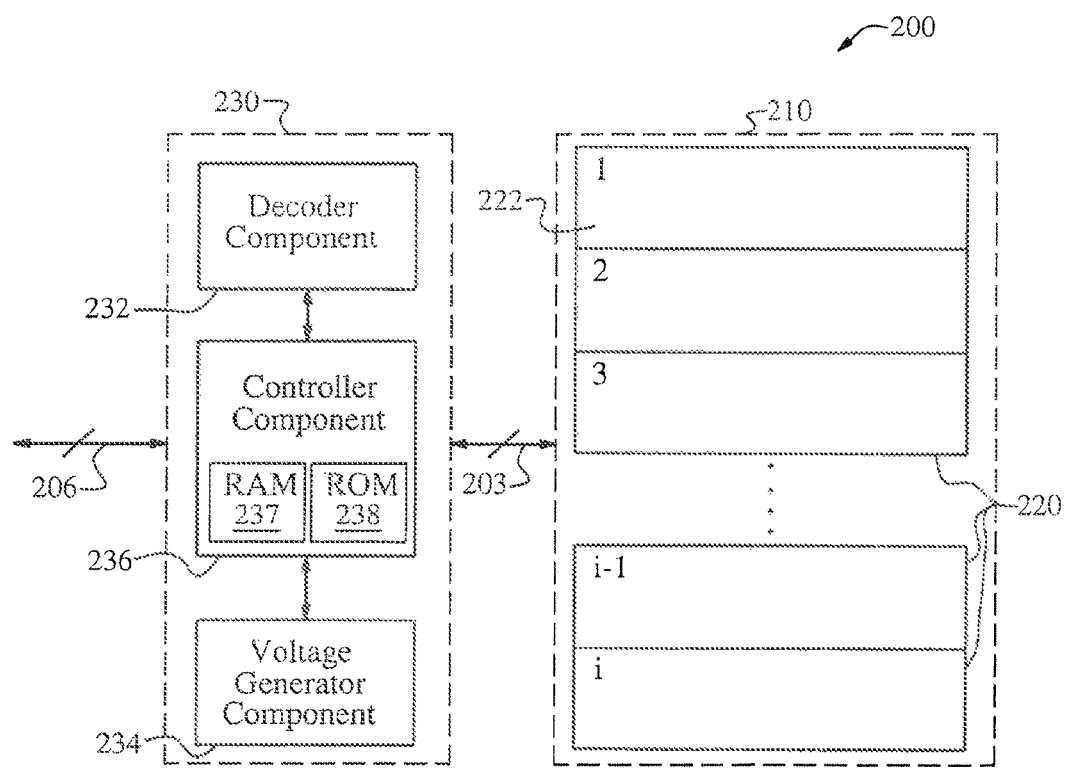
FIG. 2 illustrates a block diagram of an embodiment of a memory that may be employed an embodiment of the system of FIG. 1.

FIG. 2 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 200 includes arrayed memory 210 and memory controller 230. Memory controller 230 is arranged to communicate addressing data and program data over signal path 206. For example, signal path 206 can provide 8, 16, or more I/O lines of data. Signal path 206 may be an embodiment of a portion of system bus 122 of FIG. 1 in some embodiments. Memory controller 230 is also configured to access arrayed memory 210 over signal path 203. For example, memory controller 230 can read, write, erase, and perform other operations at portions of arrayed memory 210 via signal path 203. In addition, although shown as single lines, signal path 203 and/or signal path 206 may be distributed across a plurality of signal lines and/or bus lines.

Arrayed memory 210 includes memory sectors 220 (identified individually as sectors 1-$i$) that can be accessed via memory controller 230. Memory sectors 220 can include, for example, 256, 512, 1024, 2048 or more sectors having memory cells that can be individually or collectively accessed. In other examples, the number and/or arrangement of memory sectors can be different. In one embodiment, for example, sectors 220 can be referred to more generally as memory blocks and/or can be configured to have a configuration that is different than a bit line, word line, and/or sector topology. Memory sectors 220 may also include a trim sector that is not accessible by normal addressing, as discussed in greater detail below.

Memory controller 230 includes decoder component 232, voltage generator component 234, and controller component 236. In some embodiments, memory controller 230 may be located on the same chip as arrayed memory 210. In other examples, other implementations of memory controller 230 are possible. For example, memory controller 230 can include a programmable microcontroller.

Decoder component 232 is arranged to receive memory addresses via addressing signal path 206 and to select individual sectors, arrays, or cells according to the architecture of arrayed memory 210.

Decoder component 232 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 210 and another portion (or another grouping of bits) can identify a core cell array within a particular sector.

Voltage generator component 234 is arranged to receive one or more supply voltages (not shown in FIG. 2) and to provide a variety of reference voltages required for reading, writing, erasing, pre-programming, soft programming, and/or under-erase verifying operations. For example, voltage generator component 234 can include one or more cascode circuits, amplifier circuits, regulator circuits, and/or switch circuits that can be controlled by controller component 236.

Controller component 236 is arranged to coordinate memory accesses such as reading, writing, and erasing; and other operations of memory 200. In one embodiment, controller component 236 is arranged to receive and transmit data from an upstream system controller (e.g., processing element 112 of FIG. 1). Such a system controller can include, for example, a processor and a static random access memory (SRAM) that can be loaded with executable processor instructions for communicating over signal path 106. In another embodiment, controller component 236 as well as other portions of memory controller 230 may be embedded or otherwise incorporated into a system controller or a portion of a system controller. Controller component 236 may include, for example, a processor and a random access memory (RAM) 237 such as static random access memory (SRAM) that can be loaded with executable processor instructions for communicating over signal path 206. Controller component 236 may include a read-only memory (ROM) 238. The processor in controller components 236 enables actions by executing processor-executable coded encoded in RAM 237. RAM 237 may load processor-executable instructions from another processor-readable medium such as ROM 238, a hard drive, arrayed memory 210, and/or the like.

Embodiments of controller component 236 can include a state machine and/or comparator circuits. State machine and comparator circuits can include any of a variety of circuits for invoking any of a myriad of algorithms for performing reading, writing, erasing, or other operations of memory 200. State machines and comparator circuits can also include, for example, comparators, amplifier circuits, sense amplifiers, combinational logic, or the like.

In some embodiments, memory 200 is a flash-based memory including flash-based memory cells, such as flash-based NOR cells, NAND cells, or hybrids of the two. In some embodiments, memory 200 is a MirrorBit™ flash memory.

Figure 3:
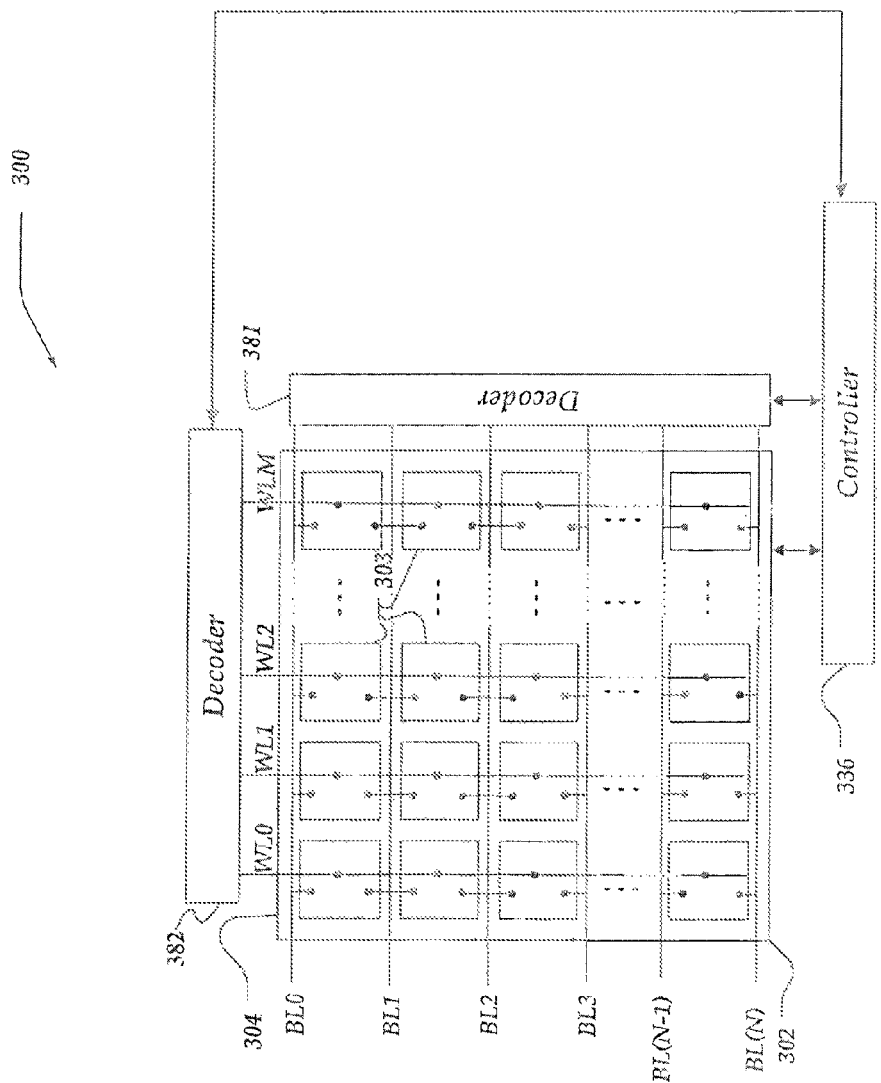
FIG. 3 illustrates a block diagram of an embodiment of a NOR memory array.

FIG. 3 illustrates a block diagram of an embodiment of memory device 300, which may be employed as an embodiment of memory device 100 of FIG. 1. Memory device 300 includes memory array 302 and individual memory cells 303 located within memory array 302. Memory cells 303 are arranged in N+1 rows and M+1 columns in memory array 302. In one embodiment, each row of memory array 302 is accessed by two of the bit lines BL0 to BLN. Each column of memory array 302 is accessed by one of word lines WL0 to WLM. Accordingly, each of memory cells 303 can be accessed by activating the corresponding bit lines and a corresponding word line of the cell. In one embodiment, each column of memory array 302 defines a data word. If N+1 has a value of 8, for example, the cells in each column of memory array 302 define a byte of data.

Memory cells 303 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CU"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

Memory device 300 further includes controller 336, decoder 381, and decoder 382.

Decoder 381 and decoder 382 can each receive address bus information from controller 336 and can utilize such information to facilitate accessing or selecting the desired memory cell(s) (e.g., memory location(s)) associated with the command, and to provide the needed voltages to the bit lines (decoder 381) and the word lines (decoder 382) according to timing that is controlled by controller 336.

Decoder 381 may also include a sector decoder in some embodiments. As such, decoder 309 may be arranged to facilitate accessing or selection particular column or grouping of columns within memory device 300. For example, a grouping of columns may define a sector, and another grouping of columns may define another sector. In another embodiment, portion 301 may include an array decoder for to a particular memory array 304. In addition, embodiments of array decoders can be configured to work separately or in conjunction with a sector decoder.

Memory controller 336 is also configured to control the activation and de-activation of individual word lines WL0 to WLM for reading, writing, and/or erasing to memory array 302. For example, memory controller 310 can provide a select signal to decoder 382 to select one of the columns WL1 to WLM to activate that column. Further, memory controller 336 can provide a select signal to decoder 381 for selecting particular rows BL0 to BLN (or sector) to be written to or read from.

Figure 4:
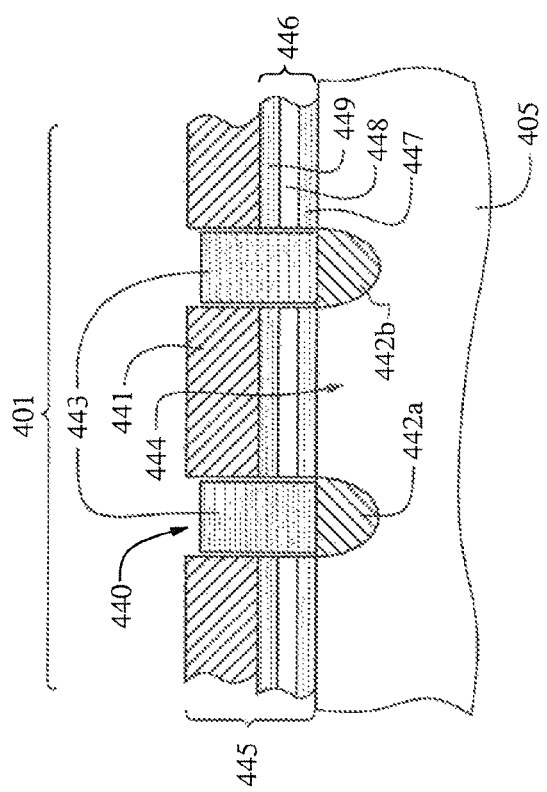
FIG. 4 shows a cross-sectional side view of an embodiment of a core section of the memory of FIG. 2.

FIG. 4 shows a cross-sectional side view of a memory cell in core section 401. In one embodiment, core section 401 is an embodiment of core section 201 of FIG. 2.

Memory cell 440 includes a portion of substrate 405, dielectric spacer layer 443, channel region 444, source/drain regions 442a and 442b, and layered stack 445, including charge trapping component 446 and a portion of core polysilicon line 441. Substrate 405 may be an embodiment of substrate 205 of FIG. 2. Source/drain regions 442a and 442b may be an embodiment of one or more conductive regions 242 of FIG. 2. Core polysilicon line 441 may be an embodiment of an individual core polysilicon line 241 of FIG. 2.

In operation, core polysilicon line 441 and source/drain regions 442a and 442b are configured to provide electrical potential(s) to memory cell 440 for trapping charge at charge trapping component 446. A bit is "programmed" when it is trapping a charge and "unprogrammed" when it is not trapping charge. To trap charge, charge trapping component 446 employs tunneling layer 447, charge trapping layer 448, and dielectric layer 449. In general, tunneling layer 447 provides a tunneling barrier, charge trapping layer 448 is a layer that is configured to store charge, and dielectric layer 449 electrically isolates charge trapping layer 448 from core polysilicon line 441. In one embodiment, memory cell 440 is a one bit memory cell that is configured to store up to two logic states. In another embodiment, memory cell 440 can store more than two logic (or bit) states.

In some embodiments, charge trapping component 446 is an oxide-nitride-oxide (ONO) layer in which dielectric layer 449 is an oxide (such as silicon dioxide), charge trapping layer 448 is a nitride, and tunneling layer 447 is an oxide (such as silicon dioxide). In one embodiment in which charge trapping layer 448 is a nitride, charge trapping layer 448 may be a silicon-rich nitride (SiRN) or a stoichiometric silicon nitride. Dielectric spacer layer 443 may be a nitride spacer, an oxide-nitride spacer, other type of spacer composed of one or more dielectric materials, or the like.

Modern semiconductor devices are typically created as integrated circuits manufactured on the surface of a substrate of semiconductor material, which is typically a wafer formed by slicing a single crystal ingot growth by a Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that transmits light through a photomask, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design, which may be stored in a machine-readable medium. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 5:
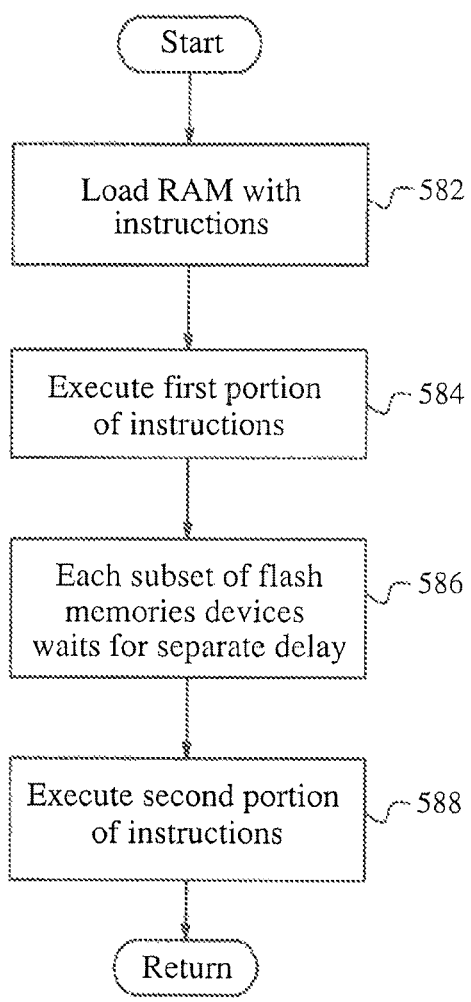
FIG. 5 illustrates a flow chart of an embodiment of a process.

FIG. 5 illustrates a flow chart of an embodiment of a process (580). Process 500 happens to each flash memory device in a group of flash memory devices when VCC reaches a pre-determined value, at which point the process begins at a start block.

The process then moves to block 582, wherein in each flash memory (e.g. 100 of FIG. 1 or 200 of FIG. 2), a RAM (e.g., RAM 237 of FIG. 2) of the flash memory is loaded with instructions. The process then advances to block 584, where each flash memory executes a first portion of instructions. The process then proceeds to block 586, where each subset of flash memory devices waits for a particular delay, where the delay of each subset is distinct from the delay of each other subset of flash memory devices. Waiting for the delay is accomplished by employing a countdown timer.

The process then moves to block 588, where each flash memory, upon completion of waiting the delay, executes a second portion of the instructions. Because each subset has a different delay, the start-ups of the various subsets of flash memories are staggered relative to each other. The process then advances to a start block, where other processing is resumed.

In one particular, specific embodiment, the staggered start is accomplished as follows. The following embodiment in no way limits the invention; rather, the purpose is to describe a particular embodiment in detail without in any way limiting the invention to the details of the particular embodiments described.

In one embodiment, a server device, which may be an embodiment of system 190 of FIG. 1, includes a controller chip (which may be an embodiment of processing element 112 of FIG. 1) and 16 DIMMs all powering off of the same motherboard. Each DIMM includes 144 flash memory devices (which may be embodiments of devices 100 of FIG. 1 and/or memory device 200 of FIG. 2). The controller chip and each of flash memory devices receive VCC from the motherboard. When the server device is powered on, power supply voltage VCC ramps upward. When VCC reaches the power on reset (POR) trip point, roughly 1.55 Volts in some embodiments, each of the flash memory devices receives a jump start command, causing it to load instructions from its ROM (e.g., 238 of FIG. 2) onto the SRAM (e.g., 237 of FIG. 2) of the flash memory device and begins executing the instructions loaded from ROM. As these instructions are executed by each device, the instructions cause the device to enter into a test mode in which data is read from the trim sector of the flash memory and written directly to SRAM. The trim sector is a portion of the arrayed memory (e.g., 210) that is not accessible by normal addressing, and is used for operation of the flash memory, which includes the initial conditions that the flash memory was tested under, including the erase verify point and the program verify point. It may also include redundancy data, such as a map of which sectors are good and which sectors are bad While in test mode, each flash memory executes code loaded from the trim sector. The code instructs the flash memory to look up a value which represents a number of wait states for the flash memory to wait before resuming execution. In some embodiments, each DIMM has nine columns, 0 through 8, and the value is the column number of the flash memory looking up the value, from 0 to 8. Each wait state may be a certain interval of time, such as 128 microseconds. Accordingly, for example, the flash memories in the first column, column 0, have no delay, the flash memories on column 1 have 128 microseconds of delay, the flash memories column 2 have 256 microseconds of delay, and so forth. Each flash memory employs a countdown counter for the delay in which the flash memory delays for the appropriate number of clock cycles. When the countdown timer expires, execution of the code in the SRAM resumes. The flash memory does not fully come up until the execution of the code that occurs until the SRAM resumes, after the delay. After the delay, the flash memory executes all the way up and is powered cleanly.

In some embodiments, staggering the start of the flash memory devices in this manner (where all of the flash memory devices are powered from a single power supply voltage) may reduce overall noise levels and keep peak current demand down during power-up conditions.

Although a particular embodiment is discussed above, many variations are within the scope and spirit of the invention. For example, in some embodiments, rather than having a fixed delay based on column number, each subset of flash memory devices may use a random delay.

Figure 6:
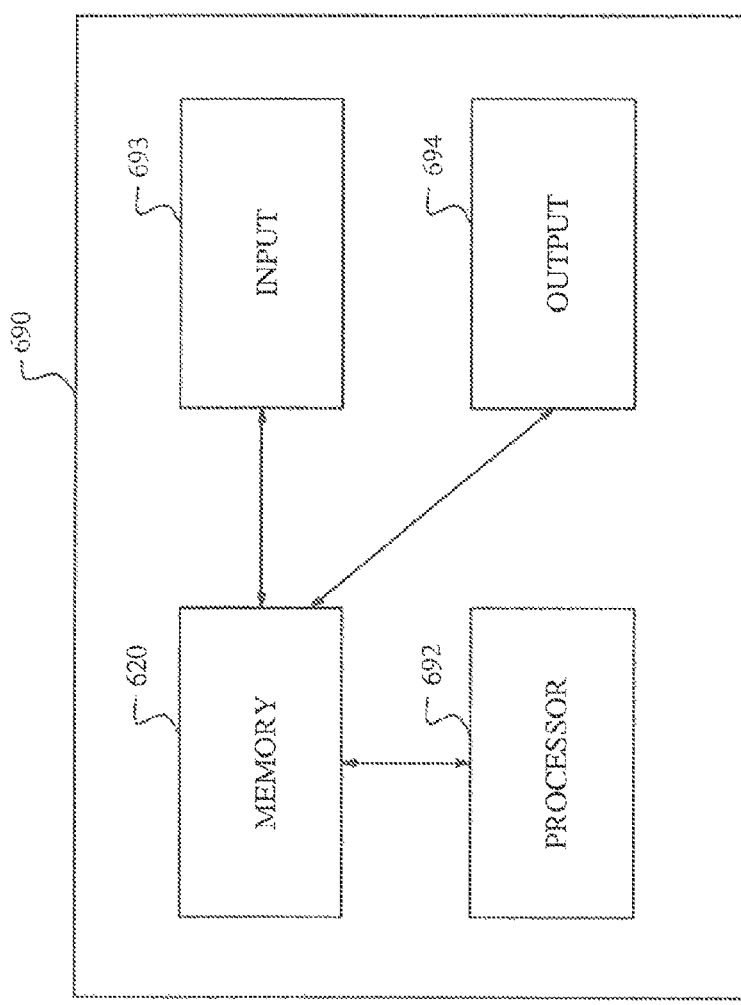
FIG. 6 illustrates a block diagram of an embodiment of a system that includes the memory device of FIG. 2, in accordance with aspects of the invention.

Embodiments of the memory device can be incorporated into any of a variety of components and/or systems, including for example, a processor and other components or systems of such components. FIG. 6 shows one embodiment of system 690, which may incorporate memory 620, which is an embodiment of memory device 100 of FIG. 1. In some embodiments, processor 692 is an embodiment of processing element 112 of FIG. 1. Memory 620 can be directly or indirectly connected to any one of processor 692, input devices 693, and/or output devices 694. In one embodiment, memory 620 may be configured such that it is removable from system 690. In another embodiment, memory 620 may be permanently connected to the components or a portion of the components of system 690.

In many embodiments, memory 620, processor 692, input devices 693, and/or output devices 694 of system 690 are configured in combination to function as part of a larger system. For example, system 690 may be incorporated into a cell phone, a handheld device, a laptop computer, a personal computer, and/or a server device. In addition or alternatively, system 690 can perform any of a variety of processing, controller, and/or data storage functions, such as those associated with sensing, imaging, computing, or other functions. Accordingly, system 690 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An apparatus, comprising:
   a plurality of memory devices, wherein each memory device of the plurality of memory devices is powered by a power supply,
   wherein, upon a voltage of the power supply reaching a pre-determined level, a first memory device of the plurality of memory devices is configured to:
      receive a first set of instructions;
      execute a first portion of the first set of instructions; and
      after executing the first portion of the first set of instructions, execute a second portion of the first set of instructions after a first delay period,
   and wherein, upon the power supply voltage reaching the pre-determined level, a second memory device of the plurality of memory devices is configured to:
      receive a second set of instructions;
      execute a first portion of the second set of instructions; and
      after executing the first portion of the second set of instructions, execute a second portion of the second set of instructions after a second delay period, the second delay period being different than the first delay period.

2. The apparatus of claim 1, wherein each memory device of the plurality of memory devices further includes a random access memory, and the first set of instructions received by the first memory device are loaded into the random access memory of the first memory device, and the second set of instructions received by the second memory device are loaded into the random access memory of the second memory device.

3. The apparatus of claim 1, further comprising at least one countdown timer configured to provide the first delay period and the second delay period.

4. The apparatus of claim 3, wherein each memory device of the plurality of memory devices includes a plurality of memory cells including a trim sector; wherein the trim sector stores a bad sector map, a program verify point, and an erase verify point; wherein the trim sector of the first memory device includes a script that causes the first memory device to employ the countdown timer to wait for the first delay period after executing the first portion of the first set of instructions for the first memory device; and wherein the trim sector of the second memory device includes a script that causes the second memory device to employ the countdown timer to wait for the second delay period after executing the first portion of the second set of instructions for the second memory device.

5. The apparatus of claim 1, wherein, each of one or more additional memory devices of the plurality of memory devices are configured to:
   execute a first portion of a corresponding set of received instructions, and
   after executing the first portion of the corresponding set of instructions, each of the one or more additional memory devices executes a second portion of the corresponding set of instructions after a corresponding delay period, the corresponding delay period being different for each of the one or more additional memory devices.

6. The apparatus of claim 1, wherein the plurality of memory devices are arranged in columns, and wherein the first memory device is located in a different column than the second memory device.

7. The apparatus of claim 1, wherein each memory device of the plurality of memory devices includes a controller component, a decoder component, and a plurality of memory cells.

8. The apparatus of claim 7, wherein each of the controller components includes means for controlling accesses to the memory cells, wherein each of the decoder components includes means for decoding, or wherein each of the memory cells includes means for storing at least one bit.

9. A method in response to a power supply voltage of a power supply reaching a pre-determined level, comprising:
   receiving a first set of instructions at a first memory device coupled to the power supply and a second set of instructions at a second memory device coupled to the power supply;
   executing, by the first memory device, a first portion of the first set of instructions;
   executing, by the second memory device, a first portion of the second set of instructions;
   after executing the first portion of the first set of instructions, executing, by the first memory device, a second portion of the first set of instructions after a first delay period; and
   after executing the first portion of the second set of instructions, executing, by the second memory device, a second portion of the second set of instructions after a second delay period, the first delay period being different than the second delay period.

10. A tangible processor-readable medium having processor-executable code encoded therein, which, upon execution by one or more processors, causes the one or more processors to perform operations upon a power supply voltage reaching a pre-determined level, the operations comprising:
    receiving a first set of instructions at a first memory device and a second set of instructions at a second memory device;
    executing a first portion of the first set of instructions;
    executing a first portion of the second set of instructions;
    after executing the first portion of the first set of instructions, executing a second portion of the first set of instructions after a first delay period; and
    after executing the first portion of the second set of instructions, executing a second portion of the second set of instructions after a second delay period, the first delay period being different than the second delay period.

\* \* \* \* \*